United States Patent [19]

Maurer

[11] 4,279,072
[45] Jul. 21, 1981

[54] ARRANGEMENT FOR THE DISASSEMBLY OF A CIRCUIT BOARD

[75] Inventor: Roland Maurer, Lauterbach, Fed. Rep. of Germany

[73] Assignee: Gebruder Junghans GmbH, Schramberg, Fed. Rep. of Germany

[21] Appl. No.: 68,598

[22] Filed: Aug. 22, 1979

[30] Foreign Application Priority Data

Sep. 12, 1978 [DE] Fed. Rep. of Germany ... 7827034[U]

[51] Int. Cl.³ .............................................. H05K 3/00
[52] U.S. Cl. ...................................... 29/764; 29/179; 29/278; 29/426.5; 29/758
[58] Field of Search ................. 29/764, 762, 758, 278, 29/179, 426.5

[56] References Cited
U.S. PATENT DOCUMENTS 4,109,379  8/1978  Ratti et al. ............................ 29/764

Primary Examiner—Carl E. Hall

Attorney, Agent, or Firm—Burns, Doane, Swecker & Mathis

[57] ABSTRACT

An arrangement is disclosed for the disassembly from a clock housing of a circuit board which carries various electromechanical and electronic components. The novel disassembly arrangement comprises an ejection device which carries several ejecting posts which can be pushed through corresponding openings in a wall of the housing to press against the circuit board and/or at least a portion of the components fastened to the board, thereby detaching this circuit board from its mounts. The circuit board is held in its position by the frictional force exerted by a contact spring which is designed in the shape of a knife-edge contact so that it will only be necessary to overcome the force of the spring during the ejection operation. The novel disassembly device, made available by the clock manufacturer for use by craftsmen, will make it possible for such person to remove the circuit board and its components rapidly and with very great ease in the case of making necessary repairs.

5 Claims, 5 Drawing Figures

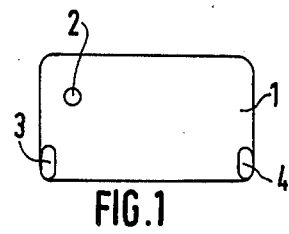
FIG.1
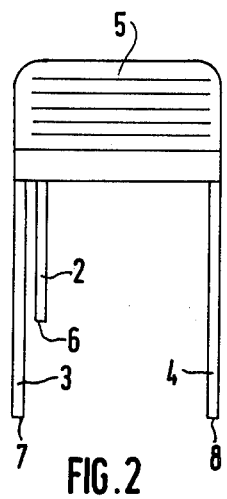
FIG.2
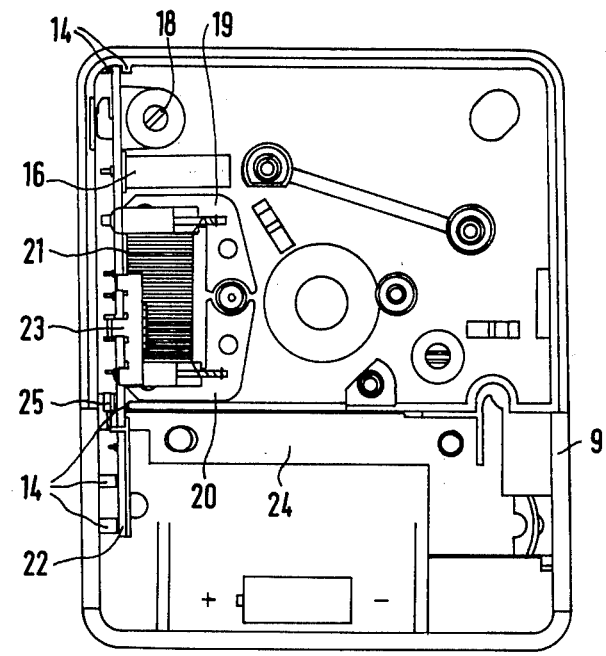
FIG.3
FIG.5
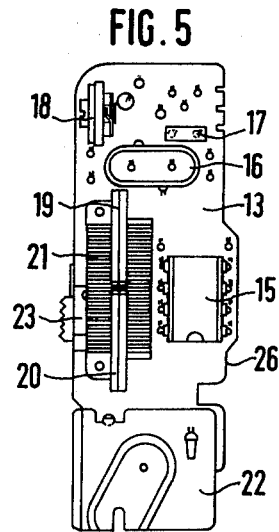
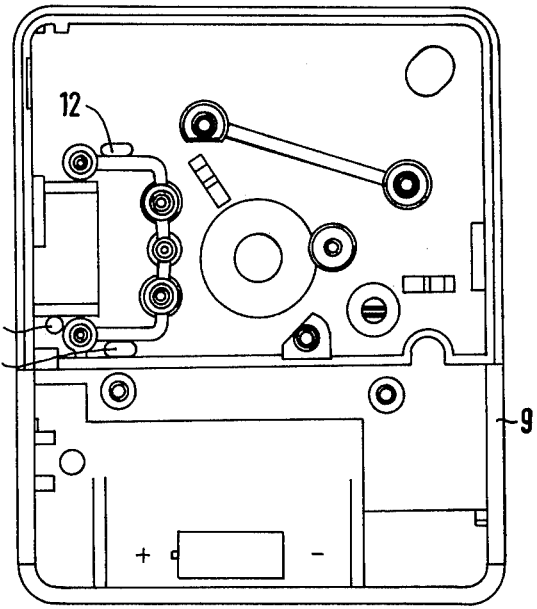
FIG.4

ARRANGEMENT FOR THE DISASSEMBLY OF A CIRCUIT BOARD

RELATED APPLICATIONS

The related disclosures of the following copending U.S. applications, filed simultaneously herewith, are incorporated herein by reference as if set forth at length:

1. U.S. Application Ser. No. 68,591 by Robert Wolber et al (corresponding to German Application No. G 78 27 035.6 filed Sept. 12, 1978).
2. U.S. Application Ser. No. 68,590 by Robert Wolber et al (corresponding to German Application No. G 78 27 030.1 filed Sept. 12, 1978).
3. U.S. Application Ser. No. 68,620 by Robert Wolber et al (corresponding to German Application No. G 78 27 031.2 filed Sept. 12, 1978).
4. U.S. Application Ser. No. 68,619 by Hans Flaig et al (corresponding to German Application No. P 28 39 611.4-34 filed Sept. 12, 1978).
5. U.S. Application Ser. No. 68,597 by Udo Schultheiss (corresponding to German Application No. G 78 27 033.4 filed Sept. 12, 1978).
6. U.S. Application Ser. No. 68,595 by Friedrich Assmus (corresponding to German Application No. P 28 39 544.2-31 filed Sept. 12, 1978).
7. U.S. Application Ser. No. 68,596 by Robert Wolber et al (corresponding to German Application No. P 28 39 555.3-31 filed Sept. 12, 1978).

BACKGROUND AND OBJECTS OF THE INVENTION

The present invention concerns an arrangement for the disassembly of a circuit board which carries various electromechanical as well as electronic components and which is coupled by mechanical forces to a housing, especially a clock housing.

It would be desirable that the drive mechanism of a clock including a circuit board and the various electromechanical and electrical components mounted thereon be easily removed from the clock housing for repair purposes.

It is an object of the invention to enable a circuit board, together with the components mounted on it, to be conveniently detached without any damage from its fastening within the housing if such action should become necessary.

BRIEF SUMMARY OF THE INVENTION

This object is achieved by an ejecting device which includes a plurality of posts. The posts are insertable through openings in the housing to engage portions of the drive mechanism and push the latter from the housing. The ejection device can be manufactured economically and of synthetic material, as by injection molding.

THE DRAWING

Details of the invention are described below at length in connection with a preferred embodiment and reference to the accompanying drawing wherein:

FIG. 1 is a plan view of an ejection device according to the invention,

FIG. 2 is a front view of the ejection device,

FIG. 3 shows a clockwork housing (back wall removed) with a circuit board mounted therein, FIG. 4 depicts the clockwork casing shown by FIG. 3 after the circuit board has been ejected, and FIG. 5 shows a non-printed side of the circuit board depicted in FIG. 3.

DETAILED DESCRIPTION OF A PREFERRED EMBODIMENT OF THE INVENTION

A novel ejection device according to the invention comprises a base plate 1, several ejecting posts 2, 3, 4 arranged on one side of the plate, and a handle 5 located at the other side of the plate. The ejection device can be produced most economically from synthetic material such as plastic, by injection molding.

The front ends 6, 7, 8, respectively of the posts 2, 3, 4, form ejecting surfaces of the ejection device. The ejecting posts 2, 3, 4 are associated with corresponding openings 10, 11, 12 (FIG. 3) formed within one wall of a housing 9, a clock housing in the case illustrated. The cross-sectional shapes of the posts match the corresponding openings.

A circuit board 13 is mounted within the housing 9 above these openings and parallel to their axial directions. The circuit board 13 is held laterally in the housing 9 by means of upper guide ribs 14.

The circuit board supports several electronic and electromechanical components which form, in conjunction with the board, an insertion module. The components involved are, as illustrated in FIGS. 3 and 5: an integrated circuit 15, a quartz resonator 16, a fixed capacitor 17, a trimmer capacitor 18, two stacks of stator laminations 19 and 20, a coil 21 of a stepping motor as well as a contact plate 22 and a slide switch 23. The parts 15 to 18 represents a circuit arrangement for the drive of the stepping motor and are arranged, together with the parts 19 to 22, on the unprinted side of the circuit board. For further details of these parts and their housing mounts, attention is directed to aforereferenced U.S. Ser. No. 68,590 of Robert Wolber et al entitled "Electrical Contact Arrangement for a Battery-Operated Instrument" and U.S. Ser. No. 68,595 of Friedrich Assmus et al entitled "Battery Operated Clock".

Numeral 24 denotes a contact spring having a leg 25 designed in the shape of a knife-edge contact. The leg 25 not only forms an electrical connection with one electronic path of the circuit board, but also presses the board against some of its guiding ribs 14, thus locking it mechanically in its inserted position. Further details of this spring actuation is directed to the above-referenced U.S. Ser. No. 68,620 by Robert Wolber et al.

It will be appreciated that the circuit board is retained in place by frictional forces created essentially by the spring 24.

For the purpose of removing the circuit board 13, the ejecting posts 2-4 are inserted into the corresponding openings 10 to 11 of the housing 9 and are advanced until the ejecting surface 7 of the first ejecting post 6 strikes the edge 26 (see FIG. 5) of the circuit board 13 while the ejecting surfaces 7, 8 of the two other posts 3 and 4, respectively, strike the two stacks of stator laminations 19 and 20 of the stepping motor.

By the exertion of pressure at the ejection device it becomes possible to detach the stacks of stator laminations 19 and 20 as well as the circuit board 13 from their respective mounts and to eject the same from the housing 9. Since all ejecting posts act upon the associated parts simultaneously, damage to these parts during the ejection operation is effectively prevented.

Although the invention has been described in connection with a preferred embodiment thereof, it will be appreciated by those skilled in the art that modifications, additions, substitutions and deletions not specifically described may be made without departing from the spirit and scope of the invention as defined in the appended claims.

What is claimed is:

1. A device for use with a housing of an electrical instrument for ejecting from such housing a modular drive means including a circuit board and electromechanical and electronic components carried by said board, the latter coupled by frictional forces to the housing, said device including a plurality of ejecting posts which are sized to be pushed through corresponding openings in a wall of the housing to press against said drive means to overcome said frictional forces and eject said board together with said components from said housing.

2. Apparatus according to claim 1, wherein said electromechanical components include a coil and two stacks of stator laminations, said ejecting device including a first post for engaging an edge of said board and second and third posts for engaging said respective stacks of laminations.

3. Apparatus according to claim 1, wherein said ejecting device includes a base plate and a handle mounted on one side thereof, said posts being mounted on an opposite side thereof.

4. Apparatus according to claim 1, wherein said ejecting device is injection molded of synthetic material.

5. Apparatus according to claim 1, wherein said instrument comprises an electric clock.

* * * * *